US012625431B2

(12) United States Patent
Shimizu et al.

(10) Patent No.: US 12,625,431 B2
(45) Date of Patent: May 12, 2026

(54) EUV RESIST UNDERLAYER FILM-FORMING COMPOSITION

(71) Applicant: NISSAN CHEMICAL CORPORATION, Tokyo (JP)

(72) Inventors: Shou Shimizu, Toyama (JP); Mamoru Tamura, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 858 days.

(21) Appl. No.: 17/793,735

(22) PCT Filed: Feb. 5, 2021

(86) PCT No.: PCT/JP2021/004201
§ 371 (c)(1),
(2) Date: Jul. 19, 2022

(87) PCT Pub. No.: WO2021/157678
PCT Pub. Date: Aug. 12, 2021

(65) Prior Publication Data

US 2023/0098881 A1 Mar. 30, 2023

(30) Foreign Application Priority Data

Feb. 7, 2020 (JP) ................................. 2020-019765

(51) Int. Cl.
*G03F 7/11* (2006.01)
*C08F 220/32* (2006.01)
(Continued)

(52) U.S. Cl.
CPC ............ *G03F 7/11* (2013.01); *C08F 220/325* (2020.02); *C08F 220/365* (2020.02); *G03F 7/20* (2013.01); *H10P 76/2041* (2026.01)

(58) Field of Classification Search
CPC . G03F 7/11; G03F 7/004; G03F 7/168; C08F 220/365; C08F 8/30; H01L 21/0274; H10P 76/2041
See application file for complete search history.

(56) References Cited

U.S. PATENT DOCUMENTS

2012/0183903 A1* 7/2012 Hatakeyama ........... G03F 7/325 430/283.1
2014/0287589 A1* 9/2014 Endo .................. H01L 21/3081 523/435
(Continued)

FOREIGN PATENT DOCUMENTS

JP 2011232632 A * 11/2011
JP 2013-064971 A 4/2013
(Continued)

OTHER PUBLICATIONS

Apr. 20, 2021 International Search Report issued in International Patent Application No. PCT/JP2021/004201.
(Continued)

*Primary Examiner* — Jonathan Johnson
*Assistant Examiner* — Alexander N. Lee
(74) *Attorney, Agent, or Firm* — OLIFF PLC.

(57) ABSTRACT

A composition for forming a resist underlayer film that enables the formation of a desired resist pattern; and a method for producing a resist pattern and a method for producing a semiconductor device, each of which uses the composition for forming a resist underlayer film. The composition for forming an EUV resist underlayer film has a basic organic group substituted with a protective group on a side chain of a (meth)acrylic polymer and further includes a solvent, but does not include a polymer other than the (meth)acrylic polymer. The organic group is an acyloxy group that has an amino group substituted with a protective
(Continued)

group, or that has a nitrogen-containing heterocycle substituted with a protective group.

9 Claims, 1 Drawing Sheet

(51) Int. Cl.

| | |
|---|---|
| ***C08F 220/36*** | (2006.01) |
| ***G03F 7/20*** | (2006.01) |
| ***H10P 76/20*** | (2026.01) |

(56) References Cited

U.S. PATENT DOCUMENTS

2015/0378260 A1* 12/2015 Endo ........................ G03F 7/094
525/540
2019/0227438 A1 7/2019 Nishita et al.
2019/0317405 A1 10/2019 Nishita et al.
2020/0124965 A1 4/2020 Nishita et al.

FOREIGN PATENT DOCUMENTS

WO 2013/058189 A1 4/2013
WO 2017/086213 A1 5/2017
WO 2018/052127 A1 3/2018
WO WO-2018143359 A1 * 8/2018 ........... C07C 275/22

OTHER PUBLICATIONS

Jul. 28, 2022 International Preliminary Report on Patentability issued in International Patent Application No. PCT/JP2021/004201.

* cited by examiner

EUV RESIST UNDERLAYER FILM-FORMING COMPOSITION

TECHNICAL FIELD

The present invention relates to a composition used in a lithography process in the production of a semiconductor, particularly in the state-of-the-art (ArF, EUV, EB, and the like) lithography process. In addition, the present invention relates to a method for producing a substrate having a resist pattern applied with the resist underlayer film, and a method for producing a semiconductor device.

BACKGROUND ART

Conventionally, lithographic microfabrication using resist compositions has been used in the production of semiconductor devices. Microfabrication is a processing method which includes forming a thin film of photoresist composition on a semiconductor substrate such as silicon wafer, irradiating the film with active beams such as ultraviolet rays through a mask pattern on which a device pattern is drawn, developing this, and then performing etching treatment on the substrate with the obtained photoresist pattern as a protective film, thereby forming micro unevenness corresponding to said pattern on the substrate surface. In recent years, because semiconductor devices have become more highly integrated, as the active beams used, EUV light (wavelength: 13.5 nm) or EB (electron beams) for cutting-edge microfabrication has also been examined for application, in addition to the conventionally used i-line (wavelength of 365 nm), KrF excimer laser (wavelength: 248 nm), ArF excimer laser (wavelength: 193 nm). In line with this, the defects of resist pattern formation due to the influences from the semiconductor substrates and the like have become a major problem. To solve this problem, a method of providing a resist underlayer film between the resist and the semiconductor substrate has been widely examined. To solve this problem, a method of providing a resist underlayer film between the resist and the semiconductor substrate has been widely examined.

Patent Literature 1 discloses an additive for a resist underlayer film-forming composition to increase the adhesion of the resist pattern formed on the resist underlayer film.

CITATION LIST

Patent Literature

Patent Literature 1: WO 2013/058189 A1

SUMMARY OF INVENTION

Technical Problem

The properties required for the resist underlayer film include, for example, not intermixing with the resist film formed on the upper layer (insoluble in resist solvent) and a higher dry etching speed than the resist film.

In the case of lithography with EUV exposure, the line width of the resist pattern formed is 32 nm or less, and the resist underlayer film for EUV exposure is formed to have a thinner film thickness than the conventional films and then is subjected for use. When forming such thin films, pinholes, agglomerations, and the like, easily occur due to the influences from the substrate surface and polymers used, making it difficult to form a uniform film without defects.

On the other hand, when forming resist patterns, in the development step, a method which uses a solvent, generally an organic solvent, that could dissolve a resist film for removing an unexposed part of the resist film, and leaving the exposed part of the resist film as a resist pattern may be adopted. In such a negative development process, improving the adhesion of the resist pattern is a major issue.

In addition, it is desired to suppress the deterioration of LWR (Line Width Roughness) when forming a resist pattern, to form a resist pattern with a good rectangular shape, and to improve resist sensitivity.

An object of the present invention is to provide a composition for forming a resist underlayer film capable of forming a desired resist pattern and a resist pattern forming method using the resist underlayer film-forming composition, which allow to solve the above-mentioned problems.

Solution to Problem

The present invention encompasses the followings.

[1]

An EUV resist underlayer film-forming composition comprising a (meth)acrylic polymer having a basic organic group substituted with a protecting group on a side chain thereof and further comprising an organic solvent, and comprising no polymer other than the (meth)acrylic polymer.

[2]

The EUV resist underlayer film-forming composition according to [1], wherein the organic group is an acyloxy group having an amino group substituted with a protecting group or an acyloxy group having a nitrogen-containing heterocyclic ring substituted with a protecting group.

[3]

The EUV resist underlayer film-forming composition according to [1] or [2], wherein the protecting group is selected from a tert-butoxycarbonyl group, a benzyloxycarbonyl group, a 9-fluorenylmethyloxycarbonyl group, a 2,2,2-trichloroethoxycarbonyl group and an allyloxycarbonyl group.

[4]

The EUV resist underlayer film-forming composition according to any one of [1] to [3], wherein the (meth)acrylic polymer is a polymer having a unit structure represented by the following formula (1):

[Chemical Formula 1]

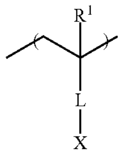

(1)

(wherein, $R_1$ represents a hydrogen atom or a methyl group, L represents a divalent linking group, and X represents an acyloxy group having an amino group substituted with a protecting group or an acyloxy group having a nitrogen-containing heterocyclic ring substituted with a protecting group.)

[5]

The EUV resist underlayer film-forming composition according to any one of [1] to [4], further comprising a crosslinking catalyst.

[6]

The EUV resist underlayer film-forming composition according to any one of [1] to [5], further comprising a crosslinking agent.

[7]

An EUV resist underlayer film, which is a baked product of an applied film consisting of the EUV resist underlayer film-forming composition according to any one of [1] to [6].

[8]

A method for producing a patterned substrate comprising:

applying and baking the EUV resist underlayer film-forming composition according to any one of [1] to [6] on a semiconductor substrate and thereby forming an EUV resist underlayer film;

applying and baking an EUV resist on the EUV resist underlayer film and thereby forming an EUV resist film;

exposing the EUV resist underlayer film and a semiconductor substrate coated with the EUV resist, and developing the exposed EUV resist film and performing pattering.

[9]

A method for producing a semiconductor device comprising:

forming an EUV resist underlayer film consisting of an EUV resist underlayer film-forming composition according to any one of [1] to [6] on a semiconductor substrate;

forming an EUV resist film on the EUV resist underlayer film;

forming an EUV resist pattern by irradiating an EUV resist film with a light or electron beam followed by development;

forming a patterned EUV resist underlayer film by etching the EUV resist underlayer film through the formed EUV resist pattern, and processing a semiconductor substrate by the patterned EUV resist underlayer film.

Advantageous Effects of Invention

The EUV resist underlayer film-forming composition of the present invention has a basic organic group substituted with a protecting group on a side chain of a (meth)acrylic polymer and further contains an organic solvent, and the EUV resist underlayer film-forming composition is characterized in that it does not contain polymers other than the above-mentioned (meth)acrylic polymer. The resist underlayer film produced by using the composition of the present application has basic organic groups substituted by protecting groups on the side chain of the (meth)acrylic polymer. After applying the composition of the present application to form a film and bake the film, amino groups are generated on the film surface, and by the adhesion to the resist being improved due to this amino group, the resist shape is free from the so-called footing and undercut, and good rectangular resist patterns can be produced. The resist underlayer film-forming composition for lithography of the present application, by adopting such configuration, can achieve suppression of LWR deterioration and improvement of sensitivity when forming a resist pattern. In particular, the EUV resist underlayer film-forming composition of the present application shows a remarkable effect than when using a resist for EUV exposure.

DESCRIPTION OF EMBODIMENTS

<EUV Resist Underlayer Film-Forming Composition>

Figure 1:
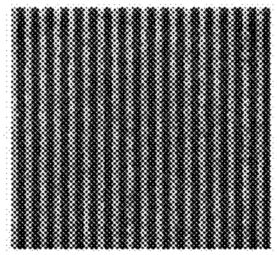
FIG. 1 is a scanning microscopic photograph taken from the upper side of the positive type resist pattern for EUV of Example 1.

The EUV resist underlayer film-forming composition of the present application comprises a (meth)acrylic polymer having a basic organic group substituted with a protecting group on a side chain thereof and further comprises an organic solvent, and the EUV resist underlayer film-forming composition does not comprise any polymer other than the above-mentioned (meth)acrylic polymer. The EUV resist underlayer film-forming composition of the present application contains only a (meth)acrylic polymer that has a basic organic group substituted with a protecting group on the side chain thereof, and does not contain any other polymers. The polymer included in the EUV resist underlayer film-forming composition of the present application is composed only a (meth)acrylic polymer that has a basic organic group substituted with a protecting group on the side chain thereof.

(Meth)acrylic polymers generally refer to polymers having a unit structure derived from one or more monomers selected from (meth)acrylic acid, (meth)acrylic esters, and their derivatives. As (meth)acrylic polymers, olefin-reacted vinyl polymerization polymer or (meth)acrylic polymer polymerized with a (meth)acrylate compound is particularly desirable. In the present invention, (meth)acrylate compounds mean both acrylate and methacrylate compounds. For example, (meth)acrylic acid means acrylic acid and methacrylic acid. The above-mentioned polymers may be produced by known methods. The above-mentioned polymers may be linear or cross-linked, but are preferably linear.

Examples of organic solvents contained in the EUV resist underlayer film-forming composition of the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more.

Of these solvents, preferred are propylene glycol monomethyl ether, propylene glycol monomethyl ether acetate, ethyl lactate, butyl lactate, and cyclohexanone. Especially preferred are propylene glycol monomethyl ether and propylene glycol monomethyl ether acetate.

A basic organic group in the present invention refers to a monovalent saturated or unsaturated group containing carbon atoms, hydrogen atoms, and at least one heteroatom (for example, at least one species selected from the group consisting of an oxygen atom, a sulfur atom, and a nitrogen atom), which is basic due to the localization of electrons in the molecular structure caused by the heteroatom. Preferably, the heteroatoms are at least two species selected from the group consisting of oxygen, sulfur, and nitrogen atoms, or at least one species selected from the group consisting of oxygen and nitrogen atoms, and more preferably are oxygen and nitrogen atoms. It is preferred that the above-mentioned organic group is an acyloxy group having an amino group substituted with a protecting group or an acyloxy group having a nitrogen-containing heterocyclic ring substituted with a protecting group.

A protecting group herein refers to a group having such a function that it is bound to the above-mentioned amino group or nitrogen-containing heterocyclic ring to prevent any change during a given chemical reaction, but is subsequently eliminated by a given means to recover the original amino group or nitrogen-containing heterocyclic ring. Suitable protecting groups include carbamate protecting groups such as t-butoxycarbonyl group, benzyloxycarbonyl group, 9-fluorenylmethyloxycarbonyl group, 2,2,2-trichloroethoxycarbonyl group, allyloxycarbonyl group; sulfonamide protecting groups such as tosyl group and nosyl group; imide protecting groups such as phthaloyl group; trifluoroacetyl group and the like. For example, when the above-mentioned protecting group is a tert-butoxycarbonyl group, an acyloxy group having an amino group protected with a tert-butoxycarbonyl group or an acyloxy group having a nitrogen-containing heterocyclic ring protected with a tert-butoxycarbonyl group is represented by the following formulas (a) to (j). Here, when the above-mentioned acyloxy group is represented by "—OC(═O)—R" (R represents an organic group having an amino group protected with a tert-butoxycarbonyl group or an organic group having a nitrogen-containing heterocyclic ring protected with a tert-butoxycarbonyl group), the tert-butoxycarbonyl group may be abbreviated as "t-Boc" or "Boc".

[Chemical Formula 2]

(a)

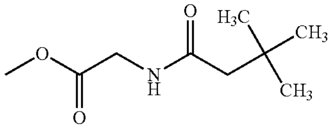

(b)

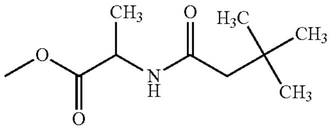

(c)

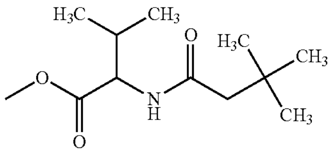

-continued (d)

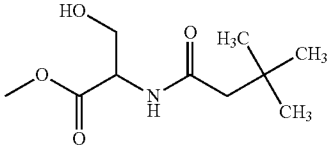

(e)

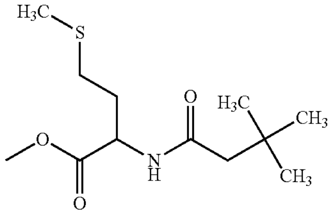

(f)

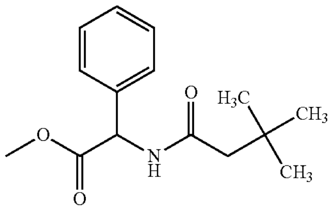

(g)

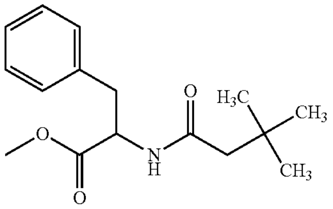

(h)

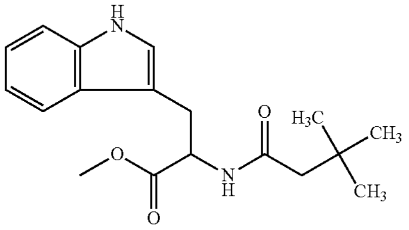

(i)

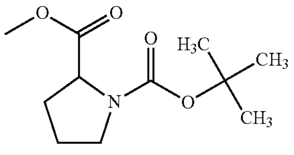

(j)

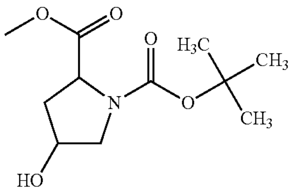

It is preferred that the above-mentioned protecting group is selected from a tert-butoxycarbonyl group, a benzyloxycarbonyl group, a 9-fluorenylmethyloxycarbonyl group, a 2,2,2-trichloroethoxycarbonyl group, and an allyloxycarbonyl group. However, of these, a tert-butoxycarbonyl group is preferred.

It is preferred that the above-mentioned (meth)acrylic polymer is a polymer having a unit structure represented by the following formula (1).

[Chemical Formula 3]

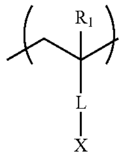

(1)

(wherein, $R_1$ represents a hydrogen atom or a methyl group, L represents a divalent linking group, and X represents an acyloxy group having an amino group substituted with a protecting group or an acyloxy group having a nitrogen-containing heterocyclic ring substituted with a protecting group.)

Preferably, the (meth)acrylic polymer of the present invention has a structural unit represented by formula (1). The (meth)acrylic polymer may be a homopolymer composed of one-component monomer polymerized, or a copolymer composed of two or more component monomers polymerized. However, a homopolymer is preferred.

The (meth)acrylic polymer of the present invention may contain one and two or more kinds of (meth)acrylic polymers having a basic organic group substituted with a protecting group on the side chain thereof. However, it contains preferably no more than two kinds, and most preferably only one kind.

The divalent linking group represented by L in formula (1) is not particularly limited; but it includes a —C(═O)$OR_2$— group, and a phenylene group, wherein $R_2$ of the —C(═O)$OR_2$— group represents an alkylene group having 1 to 10 carbon atoms, and wherein part of the hydrogen atoms of the alkylene group may be replaced by a hydroxy group or a halogen atom.

Examples of alkylene groups having 1 to 10 carbon atoms include a methylene group, an ethylene group, an n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, an n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, an n-hexylene group, a 1-methyl-n-pentylene group, a 2-methyl-n-pentylene group, a 3-methyl-n-pentylene group, a 4-methyl-n-pentylene group, a 1,1-dimethyl-n-butylene-group, a 1,2-dimethyl-n-butylene group, a 1,3-dimethyl-n-butylene group, a 2,2-dimiethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, an n-heptylene group, an -octylene group, an n-nonylene group, or an n-decanylene group.

Examples of halogen atoms include fluorine atoms, chlorine atoms, bromine atoms and iodine atoms.

The meta(acrylic) polymer having the structural unit represented by formula (1) is obtained, for example, by reacting a (meth)acrylic polymer having an epoxy group at a terminal with a monomer that reacts with the epoxy group. Examples of such monomers include: N-(tert-butoxycarbonyl)glycine, N-(tert-butoxycarbonyl)alanine, N-(tert-butoxycarbonyl)valine, N-(tert-butoxycarbonyl)leucine, N-(tert-butoxycarbonyl)isoleucine, N-(tert-butoxycarbonyl) methionine, N-(tert-butoxycarbonyl)serine, N-(tert-butoxycarbonyl)threonine, N-(tert-butoxycarbonyl)proline, N-(tert-butoxycarbonyl)histidine, N-(tert-butoxycarbonyl) phenylalanine, N-(tert-butoxycarbonyl)tyrosine, N-(tert-butoxycarbonyl)tryptophan, O-(benzyl-N-(tert-butoxycarbonyl)serine, 4-benzyl N-(tert-butoxycarbonyl)-aspartate, 5-benzyl N-(tert-butoxycarbonyl)glutamate, N-(tert-butoxycarbonyl)asparagine, N-(tert-butoxycarbonyl)-S-benzylcysteine, N-(tert-butoxycarbonyl)-O-benzylthreonine, N-(tert-butoxycarbonyl)-O-benzyltyrosine, N-(tert-butoxycarbonyl)-O-tert-butyltyrosine, N-(tert-butoxycarbonyl)-N-carbobenzoxylidine, N-(tert-butoxycarbonyl)-3,4-difluorophenylalanine, N-(tert-butoxycarbonyl)-4-fluorophenylalanine, N-(tert-butoxycarbonyl)-N1-formyltryptophan, N-(tert-butoxycarbonyl)glutamine, N-(tert-butoxycarbonyl)-4-hydroxyproline, N-(tert-butoxycarbonyl)-4-nitrophenylalanine, N-(tert-butoxycarbonyl)-paratoluenesulfonyl histidine, N-(benzyloxycarbonyl)glycine, N-(benzyloxycarbonyl) alanine, N-(benzyloxycarbonyl)valine, N-(benzyloxycarbonyl)leucine, N-(benzyloxycarbonyl)isoleucine, N-(benzyloxycarbonyl)methionine, N-(benzyloxycarbonyl)serine, N-(benzyloxycarbonyl)threonine, N-(benzyloxycarbonyl) proline, N-(benzyloxycarbonyl)-histidine, N-(benzyloxycarbonyl)phenylalanine, N-(benzyloxycarbonyl)tyrosine, N-(benzyloxycarbonyl)tryptophan, O-benzyl-N-(benzyloxycarbonyl)serine, 4-benzyl N-(benzyloxycarbonyl)aspartate, 5-benzyl N-(benzyloxycarbonyl)glutamate, N-(benzyloxycarbonyl)asparagine, N-(benzyloxycarbonyl)-S-benzylcysteine, N-(benzyloxycarbonyl)-O-benzylthreonine, N-(benzyloxycarbonyl)-O-benzyltyrosine, N-(benzyloxycarbonyl)-O-tert-butyltyrosine, N-(benzyloxycarbonyl)-N-carbobenzoxylidine, N-(benzyloxycarbonyl)-3,4-difluorophenylalanine, N-(benzyloxycarbonyl)-4-fluorophenylalanine, N-(benzyloxycarbonyl)-N1-formyltryptophan, N-(benzyloxycarbonyl)glutamine, N-(benzyloxycarbonyl)-4-hydroxyproline, N-(benzyloxycarbonyl)-4-nitrophenylalanine, N-(benzyloxycarbonyl)-paratoluenesulfonyl histidine, N-(9-fluorenylmethyloxycarbonyl)glycine, N-(9-fluorenylmethyloxycarbonyl)alanine, N-(9-fluorenylmethyloxycarbonyl)valine, N-(9-fluorenylmethyloxycarbonyl)leucine, N-(9-fluorenylmethyloxycarbonyl)isoleucine, N-(9-fluorenylmethyloxycarbonyl)methionine, N-(9-fluorenylmethyloxycarbonyl)serine, N-(9-fluorenylmethyloxycarbonyl) threonine, N-(9-fluorenylmethyloxycarbonyl)proline, N-(9-fluorenylmethyloxycarbonyl)-histidine, N-(9-fluorenylmethyl)oxycarbonyl)phenylalanine, N-(9-fluorenylmethyloxycarbonyl)tyrosine, N-(9-fluorenylmethyloxycarbonyl)tryptophan, O-benzyl-N-(9-fluorenylmethyloxycarbonyl)serine, 4-benzyl N-(9-fluorenylmethyloxycarbonyl)aspartate, 5-benzyl N-(9-fluorenylmethyloxycarbonyl) glutamate, N-(9-fluorenylmethyloxycarbonyl)asparagine, N-(9-fluorenylmethyloxycarbonyl)-S-benzylcysteine, N-(9-fluorenylmethyloxycarbonyl)-O-benzylthreonine, N-(9-fluorenylmethyloxycarbonyl)-O-benzyltyrosine, N-(9-fluorenylmethyloxycarbonyl)-O-tert-butyl tyrosine, N-(9-fluorenylmethyloxycarbonyl)-N-carbobenzoxylidine, N-(9-fluorophenylmethyloxycarbonyl)-3,4-difluorophenylalanine, N-(9-fluorenylmethyloxycarbonyl)-4-fluorophenylalanine, N-(9-fluorenylmethyloxycarbonyl)-N1-formyltryptophan, N-(9-fluorenylmethyloxycarbonyl) glutamine, N-(9-fluorenylmethyloxycarbonyl)-4-hydroxyproline, N-(9-fluorenylmethyloxycarbonyl)-4-nitrophenylalanine, N-(9-fluorenylmethyloxycarbonyl)-paratoluenesulfonyl histidine, N-(2,2,2-trichloroethoxycarbonyl)glycine, N-(2,2,2-trichloroethoxycarbonyl)alanine, N-(2,2,2-trichloroethoxycarbonyl)valine, N-2,2,2-trichloroethoxycarbonyl)lcucine, N-(2,2,2-trichloroethoxycarbonyl)isoleucine, N-(2,2,2-trichloroethoxycarbonyl)methionine, N-(2,2,2-trichloroethoxycarbonyl)serine, N-(2,2,2-trichloroethoxycarbonyl) threonine, N-(2,2,2-trichloroethoxycarbonyl)proline, N-(2,2,2-trichloroethoxycarbonyl)-histidine, N-(2,2,2-trichloroethoxycarbonyl)phenylalanine, N-(2,2,2-trichloroethoxycarbonyl)tyrosine, N-(2,2,2-trichloroethoxycarbonyl)tryptophan, O-benzyl-N-(2,2,2-trichloroethoxycarbonyl)serine, 4-benzyl N-(2,2,2-trichloroethoxycarbonyl)aspartate, 5-benzyl N-(2,2,2-trichloroethoxycarbonyl)glutamate, N-(2,2,2-trichloroethoxycarbonyl)asparagine, N-(2,2,2-trichloroethoxycarbonyl)-S-benzylcysteine, N-(2,2,2-trichloroethoxycarbonyl)-O-benzylthreonine, N-(2,2,2-trichloroethoxycarbonyl)-O-benzyltyrosine, N-(2,2,2-trichloroethoxycarbonyl)-O-tert-butyltyrosine, N-(2,2,2-trichloroethoxycarbonyl)-N-carbobenzoxylidine, N-(2,2,2-trichloroethoxycarbonyl)-3,4-difluorophenylalanine, N-(2,2,2-trichloroethoxycarbonyl)-4-fluorophenylalanine, N-(2,2,2-trichloroethoxycarbonyl)-N1-formyltryptophan, N-(2,2,2-trichloroethoxycarbonyl)glutamine, N-(2,2,2-trichloroethoxycarbonyl)-4-hydroxyproline, N-(2,2,2-trichloroethoxycarbonyl)-4-nitrophenylalanine, N-(2,2,2-trichloroethoxycarbonyl)-paratoluenesulfonyl histidine, N-(allyloxycarbonyl)glycine, N-(allyloxycarbonyl)alanine, N-(allyloxycarbonyl)valine, N-(allyloxycarbonyl)leucine, N-(allyloxycarbonyl)isoleucine, N-(allyloxycarbonyl) methionine, N-(allyloxycarbonyl)serine, N-(allyloxycarbonyl)threonine, N-(allyloxycarbonyl)proline, N-(allyloxycarbonyl)-histidine, N-(allyloxycarbonyl) phenylalanine, N-(allyloxycarbonyl)tyrosine, N-(allyloxycarbonyl)tryptophan, O-benzyl-N-(allyloxycarbonyl)serine, 4-benzyl N-(allyloxycarbonyl)aspartate, 5-benzyl N-(allyloxycarbonyl)glutamate, N-(allyloxycarbonyl)asparagine, N-(allyloxycarbonyl)-S-benzylcysteine, N-(allyloxycarbonyl)-O-benzylthreonine, N-(allyloxycarbonyl)-O-benzyltyrosine, N-(allyloxycarbonyl)-O-tert-butyltyrosine, N-(allyloxycarbonyl)-N-carbobenzoxylidine, N-(allyloxycarbonyl)-3,4-difluorophenylalanine, N-(allyloxycarbonyl)-4-fluorophenylalanine, N-(allyloxycarbonyl)-N1-formyltryptophan, N-(allyloxycarbonyl)glutamine, N-(allyloxycarbonyl)-4-hydroxyproline, N-(allyoxycarbonyl)4-nitrophenylalanine, N-(allyloxycarbonyl)-paratoluenesulfonyl histidine, Of these, N-(tert-butoxycarbonyl)glycine, N-(tert-butoxycarbonyl)alanine, N-(tert-butoxycarbonyl)leucine, N-(tert-butoxycarbonyl)methionine, N-(tert-butoxycarbonyl)serine, N-(tert-butoxycarbonyl)proline, and N-(tert-butoxycarbonyl)-4-hydroxyproline are preferred.

The weight average molecular weight of the meta(acrylic) polymer is, for example, within the range of 2,000 to 50,000. The above-mentioned weight average molecular weight may be measured, for example, by gel permeation chromatography described in the Examples below.

The content ratio of the (meth)acrylic polymer to the entire above-mentioned resist underlayer film-forming composition is within the range of 0.01% by weight to 1.00% by weight, preferably 0.01% by weight to 0.90% by weight, preferably 0.01% by weight to 0.80% by weight, preferably 0.01% by weight to 0.70% by weight, preferably 0.01% by weight to 0.60% by weight, preferably 0.01% by weight to 0.50% by weight, preferably 0.01% by weight to 0.49% by weight, preferably 0.01% by weight to 0.45% by weight, preferably 0.01% by weight to 0.4% by weight, preferably 0.01% by weight to 0.3% by weight, and preferably 0.01% by weight to 0.2% by weight.

Examples of crosslinking catalyst (curing catalyst) included as an optional ingredient in the resist underlayer forming composition of the present invention are, for example, sulfonic acid compounds and carboxylic acid compounds, such as p-toluenesulfonic acid, trifluoromethanesulfonic acid, pyridinium-p-toluenesulfonate (pyridinium-p-toluenesulfonate), pyridinium-p-hydroxybenzenesulfonic acid (p-phenolsulfonic acid pyridinium salt), pyridinium-trifluoromethanesulfonic acid, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, hydroxybenzoic acid. When the above-mentioned crosslinking catalyst is used, the content ratio of said crosslinking catalyst is, for example, within the range of 0.1% to 50% by mass, preferably 1% to 30% by mass, of the crosslinking agent. Examples of the cross-linking agent contained as an optional ingredient in the resist underlayer film-forming composition of the present invention are, for example, hexamethoxymethylmelamine, tetramethoxymethylbenzoguanamine 1,3,4,6-tetrakis(methoxymethyl)glycoluryl(tetrametboxymethylglycol uryl) (POWDERLINK [registered trademark] 1174), 1,3,4,6-tetrakis(butoxymethyl)glycoluryl, 1,3,4,6-tetrakis(hydroxymethyl)glycoluryl, 1,3-bis(hydroxymethyl)urea, 1,1,3,3-tetrakis(butoxymethyl)urea and 1,1,3,3-tetrakis(methoxymethyl)urea. When the above-mentioned crosslinking agent is used, the content ratio of the crosslinking agent is, for example, within the range of 1% by mass to 50% by mass, preferably 5% by mass to 30% by mass of the polymer.

A surfactant may be further added to the resist underlayer film-forming composition of the present invention to further improve the applicability to uneven surfaces without the occurrence of pinholes, striations, and the like. Examples of surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants, such as EFTOP EF301, EF303, EF352 (Product Name: manufactured by Tohkem Products Corp.), MEGAFACE F171, F173, R-30 (Product Name: manufactured by Dainippon Ink and Chemicals, Inc.), Fluorad FC430, FC431 (Product Name: manufactured by Sumitomo 3M Ltd.), and AsahiGuard AG710, Surflon S-382, SC101, SC102, SC103, SC104, SC105, SC106 (Product Name: manufactured by Asahi Glass Co., Ltd.), and organosiloxane polymer KP341 (manufactured by Shin-Etsu Chemical Co., Ltd.). These surfactants are incorporated in an amount of generally less than 2.0% by mass, preferably less than 1.0% by mass, to the total solid content of the resist underlayer film-forming composition of the present invention. These surfactants may be added each alone or in combination of two or more.

<EUV Resist Underlayer Film and Method for Producing of EUV Resist Underlayer Film>

The resist underlayer film-forming composition of the present invention may be produced by applying the above-described resist underlayer film-forming composition onto a semiconductor substrate and baking the substrate.

Examples of semiconductor substrates to which the resist underlayer film-forming composition of the present invention is applied include a silicon wafer, a germanium wafer, and compound semiconductor wafers, such as gallium arsenide, indium phosphide, gallium nitride, indium nitride, and aluminum nitride.

When a semiconductor substrate having an inorganic film formed on the surface is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a BPSG (Boro-Phospho Silicate Glass) film, a titanium nitride film, a titanium nitride oxide film, a tungsten film, a gallium nitride film, and a gallium arsenide film.

The resist underlayer film-forming composition of the present invention is applied onto such semiconductor substrate by an appropriate application method, such as a spinner or a coater. Then, the applied composition is baked using a heating means, such as a hotplate, to form a resist underlayer film. The conditions for baking are appropriately selected from those at a baking temperature from 100 to 400° C. for a baking time from 0.3 to 60 minutes. Preferred conditions for baking are those at a baking temperature from 120 to 350° C. for a baking time from 0.5 to 30 minutes, and more preferred conditions are those at a baking temperature from 150 to 300° C. for a baking time from 0.8 to 10 minutes.

The film thickness of the EUV resist underlayer film formed is, for example, within the range of from 0.001 μm (1 nm) to 10 μm, from 0.002 μm (2 nm) to 1 μm, from 0.005 μm (5 nm) to 0.5 μm (500 nm), from 0.001 μm (1 nm) to 0.05 μm (50 nm), from 0.002 μm (2 nm) to 0.05 μm (50 nm), from 0.003 μm (1 nm) to 0.05 μm (50 nm), from 0.004 μm (4 nm) to 0.05 μm (50 nm), from 0.005 μm (5 nm) to 0.05 μm (50 nm), from 0.003 μm (3 nm) to 0.03 μm (30 nm), from 0.003 μm (3 nm) to 0.02 μm (20 nm), and from 0.005 μm (5 nm) to 0.02 μm (20 nm). When the temperature at the baking stage is lower than the above range, cross-linking may unsatisfactorily proceed. To the contrary, when the temperature at baking stage is higher than the above range, the resist underlayer film may undergo decomposition due to heat.

<Methods for Producing Patterned Substrates and Semiconductor Devices>

Methods for producing patterned substrates involve the following steps. Usually, it is produced by forming a photoresist layer on top of an EUV resist underlayer film. There are no particular restrictions as to the photoresist to be formed by coating and baking on the EUV resist underlayer film by a known method per se, as long as the photoresist is sensitive to the light used for exposure. Both negative type photoresist and positive type photoresist could be used. These include positive type photoresists composed of novolac resin and 1,2-naphthoquinone diazide sulfonic acid ester, chemically amplified type photoresists composed of a binder having a group that is degraded by an acid to increase the alkali dissolution rate and a photoacid generator; chemically amplified type photoresists composed of a low molecular weight compound that is degraded by an acid to increase the alkali dissolution rate of the photoresist, an alkaline soluble binder, and a photoacid generator; chemically amplified type photoresists composed of a binder having a group that is degraded by an acid to increase the alkali dissolution rate of the photoresist, a low molecular weight compound that is degraded by an acid to increase the alkali dissolution rate of the photoresist, and a photoacid generator, and resists containing metal elements. Examples include V146G (trade name) manufactured by JSR Corporation, APEX-E (trade name) manufactured by Shipley, PAR710 (trade name) manufactured by Sumitomo Chemical Co. Ltd., AR2772, SEPR430 (trade names) manufactured by Shin-Etsu Chemical Co., Ltd. Furthermore, for example, fluoroatom-containing polymer-based photoresists that are disclosed in, Proc. SPIE, Vol. 3999, 330-334(2000), Proc. SPIE, Vol. 3999, 357-364(2000), and Proc. SPIE, Vol. 3999, 365-374(2000), are included.

Moreover, although not limited thereto, the so-called resist compositions such as resist compositions, radiation-sensitive resin compositions, high-resolution patterning compositions based on organometallic solution, and metal-containing resist compositions disclosed in the following could be used: WO2019/188595, WO2019/187881, WO2019/187803, WO2019/167737, WO2019/167725, WO2019/187445, WO2019/167419, WO2019/123842, WO2019/054282, WO2019/058945, WO2019/058890, WO2019/039290, WO2019/044259, WO2019/044231, WO2019/026549, WO2018/193954A, WO2019/172054, WO2019/021975, WO2018/230334, WO2018/194123, JP2018-180525A, WO2018/190088, JP2018-070596A, JP2018-028090A, JP2016-153409A, JP2016-130240A, JP2016-108325A, JP2016-047920A, JP2016-035570A, JP2016-035567A, JP2016-035565A, JP2019-101417A, JP2019-117373A, JP2019-052294A, JP2019-008280A, JP2019-008279A, JP2019-003176A, JP2019-003175A, JP2018-197853A, JP2019-191298A, JP2019-061217A, JP2018-045152A, JP2018-022039A, JP2016-090441A, JP2015-10878A, JP2012-168279A, JP2012-022261A, JP2012-022258A, JP2011-043749A, JP2010-181857A, JP2010-128369A, WO2018/031896, JP2019-113855A, WO2017/156388, WO2017/066319, JP2018-41099A, WO2016/065120, WO2015/026482, JP2016-29498A, JP2011-253185A, and the like.

Resist compositions include, for example, the following: An active light-sensitive or radiation-sensitive resin composition containing a resin A having a repeating unit having an acid degradable group whose polar group is protected by a protective group that is removed by the action of an acid, and a compound represented by the general formula (1):

[Chemical Formula 4]

(11)

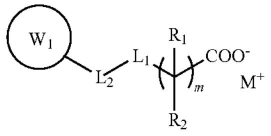

wherein, m represents an integer from 1 to 6.

$R_1$ and $R_2$ each independently represents a fluorine atom or a perfluoroalkyl group.

$L_1$ represents —O—, —S—, —COO—, —$SO_2$—, or —$SO_3$—.

$L_2$ represents an alkylene group that may have a substituent or a single bond.

$W_1$ represents a cyclic organic group that may have a substituent.

$M^+$ represents a cation.

A metal-containing film-forming composition for extreme ultraviolet or electron beam lithography, containing a compound having a metal-oxygen covalent bond and a solvent, wherein the metal elements constituting the above-mentioned compound belong to periods 3 to 7 of groups 3 to 15 of the periodic table.

A radiation-sensitive resin composition containing a polymer having a first structural unit represented by the following formula (1) and a second structural unit containing an acid-dissociating group represented by the following formula (2), and an acid generator:

[Chemical Formula 5]

(21)

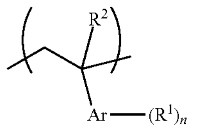

(22)

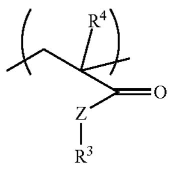

wherein, in formula (21), Ar is a group where (n+1) hydrogen atom is removed from an arene having 6 to 20 carbon atoms; $R^1$ is a hydroxy group, a sulfanyl group, or a monovalent organic group having 1 to 20 carbon atoms; n is an integer from 0 to 11; if n is 2 or more, a plurality of $R^1$ is identical or different; $R^2$ is a hydrogen atom, a fluorine atom, a methyl group or a trifluoromethyl group.

wherein, in formula (22), $R^3$ is a monovalent group having a number of carbon of 1 to 20 containing the above-mentioned acid-dissociating group; Z is a single bond, an oxygen atom or a sulfur atom; $R^4$ is a hydrogen atom, a fluorine atom, a methyl group or a trifluoromethyl group.

A resist composition containing a resin (A1) containing a structural unit having a cyclic carbonate ester structure, a structural unit represented by formula (II) and a structural unit represented by an acid unstable group, and an acid generator.

[Chemical Formula 6]

(II)

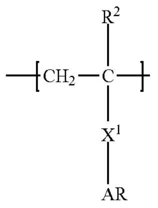

wherein, $R^2$ represents an alkyl group having 1 to 6 carbon atoms that may have a halogen atom, a hydrogen atom or a halogen atom, $X^1$ represents a single bond, —CO—O—* or —CO—$NR^4$—*, where * represents a bonding hand with —Ar, $R^4$ represents a hydrogen atom or an alkyl group having 1 to 4 carbon atoms, Ar represents an aromatic hydrocarbon group having 6 to 20 carbon atoms that may have one or more groups selected from the group consisting of a hydroxy group and a carboxyl group.

A resist composition that generates acid upon exposure and whose solubility in the developer is changed by the action of acid characterized by comprising: a base material component (A) whose solubility in the developer is changed by the action of acid and a fluorine additive component (F) that is degradable in an alkaline developer, wherein the fluorine additive component (F) contains the fluorine resin component (F1) having a structural unit (f1) containing a base-dissociating group and a structural unit (f2) containing a group represented by the following general formula (f2-r-1).

[Chemical Formula 7]

(f2-r-I)

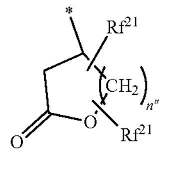

wherein, $Rf^{21}$ is each independently a hydrogen atom, an alkyl group, an alkoxy group, a hydroxy group, a hydroxyalkyl group or a cyano group; n'' is an integer from 0 to 2, and * is a bonding hand.

wherein the structural unit (f1) includes a structural unit represented by the following general formula (f1-1) or a structural unit represented by the following general formula (f1-2):

[Chemical Formula 8]

(f1-1)

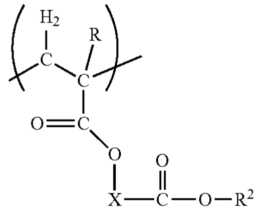

(f1-2)

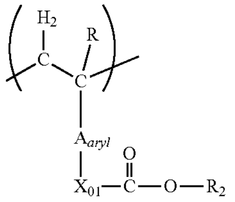

wherein, in formula (f1-1) and formula (f1-2), R is each independently a hydrogen atom, an alkyl group having 1 to 5 carbon atoms, or a halogenated alkyl group having 1 to 5 carbon atoms; X is a divalent linkage group without an acid-dissociating moiety; $A_{aryl}$ is a divalent aromatic cyclic group that may have substituents; $X_{01}$ is a single bond or a divalent linking group; $R^2$ are each independently an organic group having a fluorine atom.

The resist films include, for example, the following:

A resist film containing a base resin containing a repeating unit represented by the following formula (a1) and/or a repeating unit represented by the following formula (a2) and a repeating unit that generates an acid bonded to the polymer main chain upon exposure.

[Chemical Formula 9]

(a1)

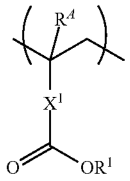

(a2)

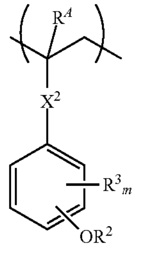

wherein, in formula (a1) and formula (a2), $R^A$ is each independently a hydrogen atom or a methyl group; $R^1$ and $R^2$ are each independently a tertiary alkyl group having 4 to 6 carbon atoms; $R^3$ is each independently a fluorine atom or a methyl group; m is an integer from 0 to 4; $X^1$ is a single bond, a phenylene group or naphthylene group, or a linkage group having 1 to 12 carbon atoms containing at least one kind selected from an ester bond, a lactone ring, a phenylene group and a naphthylene group; $X^2$ is a single bond, an ester bond or an amide bond.

The resist materials include, for example, the following.

A resist material containing a polymer having a repeating unit represented by the following formula (a1) or formula (a2):

[Chemical Formula 10]

(b1)

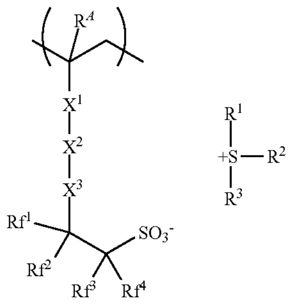

(b2)

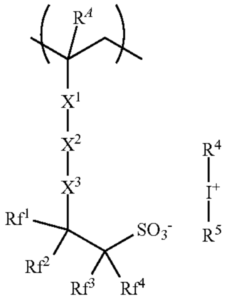

wherein, in formula (b1) and formula (b2), $R^A$ is a hydrogen atom or a methyl group; $X^1$ is a single bond or an ester group; $X^2$ is a linear, branched or cyclic alkylene group having 1 to 12 carbon atoms or an arylene group having 6 to 10 carbon atoms, wherein a part of a methylene group constituting the alkylene group may be partially substituted with an ether group, an ester group or a lactone ring-containing group, and at least one hydrogen atom contained in $X^2$ is substituted with a bromine atom; $X^3$ is a single bond, an ether group, an ester group, or a linear, branched or cyclic alkylene group having 1 to 12 carbon atoms, and a part of a methylene group constituting the alkylene group may be partially substituted with an ether group or an ester group; $Rf^1$ to $Rf^4$ are each independently hydrogen atom, fluorine atom or trifluoromethyl group; however, at least one of them is a fluorine atom or a trifluoromethyl group. Moreover, $Rf^1$ and $Rf^2$ may also be combined to form a carbonyl group. $R^1$ to $R^5$ are each independently a linear, branched or cyclic alkyl group having 1 to 12 carbon atoms, a linear, branched or cyclic alkenyl group having 2 to 12 carbon atoms, an alkynyl group having 2 to 12 carbon atoms, an aryl group having 6 to 20 carbon atoms, an aralkyl group having 7 to 12 carbon atoms or an aryloxyalkyl group having 7 to 12 carbon atoms, a part or all of the hydrogen atom of these groups may be substituted with a hydroxy group, a carboxy group, an halogen atom, an oxo group, a cyano group, an amide group, a nitro group, a sultone group, a sulfone group or sulfonium salt-containing group, and a part of the methylene groups constituting these groups may be partially substituted with an ether, an ester, a carbonyl group, a carbonate group, or a sulfonate ester group; in addition, $R^1$ and $R^2$ may bind to form a ring together with the sulfur atom to which they are bonded.

A resist material containing a base resin containing a polymer having a repeating unit represented by the following formula (a):

[Chemical Formula 11]

(a)

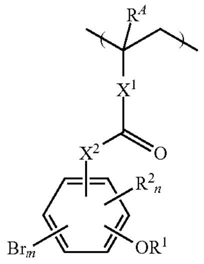

wherein, $R^A$ is a hydrogen atom or a methyl group; $R^1$ is a hydrogen atom or an acid unstable group; $R^2$ is a linear, branched or cyclic alkyl group having 1 to 6 carbon atoms, or a halogen atom other than bromine; $X^1$ is a single bond or phenylene group, or a linear, branched or cyclic alkylene group having 1 to 12 carbon atoms which may contain an ester group or a lactone ring; $X^2$ is —O—, —O—$CH_2$— or —NH—; m is an integer from 1 to 4; n is an integer from 0 to 3.

The metal-containing resist compositions include, for example, the following: Coatings containing metal oxo-hydroxo networks having organic ligands by metal-carbon bond and/or metal-carboxylate bond;

Inorganic oxo/hydroxo based compositions.

The coating solutions include, for example, the following:

A coating solution containing an organic solvent; a first organometallic composition, represented by formula $R_ZSnO_{(2-(z/2)-(x/2))}(OH)_x$ (where $0<z\geq 2$ and $0<(z+x)\geq 4$), formula $R_n'SnX_{4-n}$ (where n=1 or 2) or mixtures thereof: wherein R and R' are independently a hydrocarbyl group having 1 to 31 carbon atoms, and X is a ligand having a hydrolysable bond to Sn or a combination of them; and a hydrolysable metal compound, represented by the formula $MX'_v$ (wherein M is a metal selected from groups 2 to 16 of the periodic table of elements, v=2 to 6, and X' is a ligand having a hydrolysable M-X bond or a combination of them).

A coating solution containing an organic solvent and a first organometallic compound represented by formula $RSnO_{(3/2-x/2)}(OH)_x$ (where $0<x<3$), wherein the solution contains about 0.0025 M to 1.5 M of tin and R is an alkyl group or a cycloalkyl group having 3 to 31 carbon atoms and said alkyl or cycloalkyl group is bonded to tin via a secondary or tertiary carbon atom.

An inorganic pattern formation precursor aqueous solution containing and composed of a mixture of water, a metal suboxide cation, a polyatomic inorganic anion, and a radiation-sensitive ligand containing and composed of a peroxide groups.

The exposure through a mask (reticle) for forming a predetermined pattern is conducted, and, an i-line, a KrF excimer laser, an ArF excimer laser, an EUV (extreme ultraviolet light), or an EB (electron beams) is used, for example. However, the resist underlayer film-forming composition of the present application is preferably applied for EUV (Extreme Ultraviolet) exposure. In development, an alkaline developer is used, and the conditions are appropriately selected from those at a development temperature from 5 to 50° C. for a development time from 10 to 300 seconds. A usable alkaline developer includes, for example, an aqueous solution of an alkali, e.g., an inorganic alkali, such as sodium hydroxide, potassium hydroxide, sodium carbonate, sodium silicate, sodium metasilicate, or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine. Further, the above-mentioned aqueous alkali solution to which alcohols, such as isopropyl alcohol, or surfactants, such as a nonionic surfactant, are added in an appropriate amount, may also be used. Of these, a preferred developer is a quaternary ammonium salt, and further preferred are tetramethylammonium hydroxide and choline. Further, for example, a surfactant and the like may be added to the above developer. A method, in which development is conducted using an organic solvent, such as butyl acetate, instead of an alkaline developer, to develop a portion with an unincreased alkali dissolution rate of the photoresist, may be used. By undergoing the above-mentioned steps, a substrate with the above-mentioned resist being patterned would be produced.

Then, using the formed resist pattern as a mask, the resist underlayer film is subjected to dry etching. In this instance, when the above-mentioned inorganic film is formed on the surface of the semiconductor substrate used, the surface of the inorganic film is exposed; and, when the inorganic film is not formed on the surface of the semiconductor substrate used, the surface of the semiconductor substrate is exposed. Then, the substrate may be processed by a substrate processing step by a method known per se (dry etching method, and the like), to produce a semiconductor device.

EXAMPLES

The following examples specifically illustrate the present invention in detail, but the present invention is not limited to these examples.

The weight average molecular weights of the polymers shown in the below-mentioned Synthesis Example 1 and Comparative Synthesis Example 1 of the present specification are the results measured by gel permeation chromatography (hereinafter referred to as GPC). A GPC apparatus manufactured by Tosoh Corp. was used for the measurement, and the measurement conditions were as follows.

GPC Column: Shodex KF803L, Shodex KF802, Shodex KF801 [registered trademark](Showa Denko K.K.)

Column temperature: 40° C.

Solvent: tetrahydrofuran (THF)

Flow rate: 1.0 mL/minute

Standard sample: Polystyrene (Manufactured by Tosoh Corp.)

Synthesis Example 1

15.00 g of polyglycidyl methacrylate (manufactured by Maruzen Petrochemical Co., Ltd.), 22.78 g of N-(tert-butoxycarbonyl)-beta-alanine (manufactured by Tokyo Kasei Kogyo Co., Ltd.), and 0.56 g of ethyltriphenylphosphonium bromide (manufactured by ACROSS) were added to 100.72 g of propylene glycol monomethyl ether acetate and dissolved. After replacing the reaction vessel with nitrogen, the reaction was carried out at 80° C. for 24 hours to obtain a polymer solution. The polymer solution did not become cloudy, when cooled to room temperature, and had a good solubility in propylene glycol monomethyl ether. GPC analysis showed that the polymer in the obtained solution had a weight average molecular weight of 15,000 as determined by standard polystyrene conversion and a degree of dispersion of 1.68. The polymer obtained in this synthetic example has the structural unit represented by the following formula (1a).

[Chemical Formula 12]

(1a)

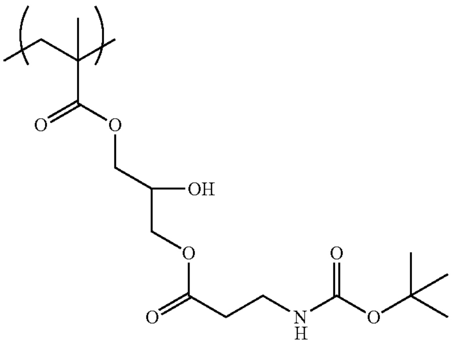

Comparative Synthesis Example 1

10.00 g of t-butoxymethacrylate (manufactured by Tokyo Kasei Kogyo Co., Ltd.), 6.10 g of 2-hydroxyethyl methacrylate (manufactured by Tokyo Kasei Kogyo Co., Ltd.), and 0.96 g of azobisisobutyronitrile (manufactured by Tokyo Kasei Kogyo Co., Ltd.) were added to 73.00 g of propylene glycol monomethyl ether and dissolved. After replacing the reaction vessel with nitrogen, the reaction was carried out at 80° C. for 24 hours to obtain a polymer solution. The polymer solution did not become cloudy, when cooled to room temperature, and had a good solubility in propylene glycol monomethyl ether. GPC analysis showed that the polymer in the obtained solution had a weight average molecular weight of 3,690 as determined by standard polystyrene conversion and a degree of dispersion of 2.25. The polymer obtained in this synthetic example has the structural unit represented by the following formula (1b) and formula (2b).

[Chemical Formula 13]

(1b)

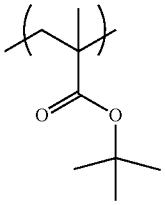

-continued (2b)

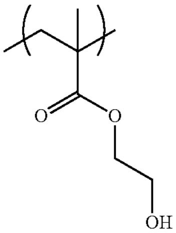

Example 1

To 3.12 g of a polymer solution containing 0.047 g of the polymer obtained in Synthesis Example 1 above, 0.11 g of tetramethoxymethylglycol uryl (manufactured by Japan Cytec Industries Inc.) and 0.012 g of p-phenolsulfonic acid pyridinium salt (manufactured by Tokyo Kasei Kogyo Co., Ltd.) were mixed; and 263.41 g of propylene glycol monomethyl ether and 29.89 g propylene glycol monomethyl ether acetate were added thereto and dissolved. Thereafter, the resulting solution was filtered with a polyethylene microfilter having a pore diameter of 0.05 μm, to prepare a resist underlayer film-forming composition for lithography.

Comparative Example 1

To 3.12 g of a polymer solution containing 0.047 g of the polymer obtained in Comparative Synthesis Example 1 above, 0.11 g of tetramethoxymethylglycol uryl (manufactured by Japan Cytec Industries Inc.) and 0.012 g of p-phenolsulfonic acid pyridinium salt (manufactured by Tokyo Kasei Kogyo Co., Ltd.) were mixed, and 263.41 g of propylene glycol monomethyl ether and 29.89 g of propylene glycol monomethyl ether acetate were added thereto and dissolved. Thereafter, the resulting solution was filtered with a polyethylene microfilter having a pore diameter of 0.05 μm, to prepare a resist underlayer film-forming composition for lithography.

[Elution Test in Photoresist Solvent]

Each of the resist underlayer film-forming compositions of Example 1 and Comparative Example 1 was applied to a silicon wafer, which is a semiconductor substrate, by a spinner. The silicon wafer was placed on a hot plate and baked at 215° C. for 1 minute to form a resist underlayer film (5 nm film thickness). The resist underlayer film was immersed in each of ethyl lactate and propylene glycol monomethyl ether, which are solvents used for photoresists, and these resist underlayer films were confirmed to be insoluble in those solvents.

[Positive Type Resist Pattern Formation by Electron Beam Lithography Device]

Each of the resist underlayer film-forming compositions of Example 1 and Comparative Example 1 was applied on a silicon wafer using a spinner. The silicon wafer was placed on a hot plate and baked at 215° C. for 60 seconds to obtain a resist underlayer film of a film thickness of 5 nm. The positive type resist solution for EUV was spin-coated on the resist underlayer film, and heated at 100° C. for 60 seconds to form an EUV resist film. The resist film was exposed to an electron beam lithography device (ELS-G130) under predetermined conditions. After the exposure, baking (PEB) was performed at 110° C. for 60 seconds and cooled to room temperature on a cooling plate. After development with alkaline developer (2.38% TMAH), a resist pattern with 25 nm line/50 nm pitch was formed. A scanning electron microscope (CG4100, manufactured by Hitachi High-Technologies Corporation) was used to measure the length of the resist pattern. The exposure amount that formed 25 nm line/50 nm pitch (line and space (L/S=1/1)) in the above resist pattern formation was taken as the optimal exposure amount.

The resulting photoresist pattern was observed from the upper side of the pattern and evaluated. A resist pattern that formed well was rated as “good” and an undesirable state in which the resist pattern peeled off and collapsed was rated as “collapsed”.

Figure 2:
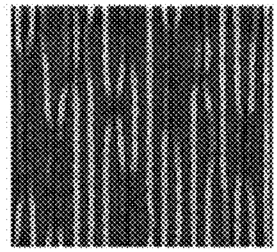
FIG. 2 is a scanning microscopic photograph taken from the upper side of the positive type resist pattern for EUV of Comparative Example 1.

The obtained results are shown in Table 1. Also, the scanning microscopic photograph (upper side of the pattern) of resist patterns in which the composition of Example 1 was applied and the scanning microscopic photograph in which the composition of Comparative Example 1 was applied are shown in FIGS. 1 and 2, respectively.

TABLE 1

| | 25 nm line |
|---|---|
| Example 1 | Good |
| Comparative Example 1 | Collapsed |

[Negative Type Resist Pattern Formation by Electron Beam Lithography Device]

Each of the resist underlayer film-forming compositions of Example 1 and Comparative Example 1 was applied on a silicon wafer using a spinner. The silicon wafer was placed on a hot plate and baked at 215° C. for 60 seconds to obtain a resist underlayer film of a film thickness of 5 nm. The negative type resist solution for EUV was spin-coated on the resist underlayer film, and heated at 100° C. for 60 seconds to form an EUV resist film. The resist film was exposed under predetermined conditions using an electron beam lithography device (ELS-G130). After the exposure, baking (PEB) was performed at 110° C. for 60 seconds and cooled to room temperature on a cooling plate. After development with butyl acetate, a resist pattern with 25 nm line/50 nm pitch was formed. A scanning electron microscope (CG4100, manufactured by Hitachi High-Technologies Corporation) was used to measure the length of the resist pattern. The exposure amount that formed 25 nm line/50 nm pitch (line and space (L/S=1/1)) in the above resist pattern formation was taken as the optimal exposure amount.

The resulting photoresist pattern was observed from the upper side of the pattern and evaluated. A resist pattern that formed well with the same exposure amount was rated as “good” and a resist pattern with residuals existing between patterns was rated as “defects”.

Figure 3:
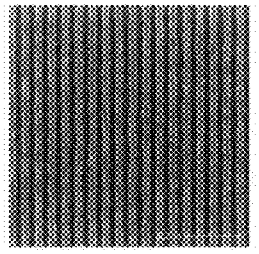
FIG. 3 is a scanning microscopic photograph taken from the upper side of the negative type resist pattern for EUV of Example 1.
Figure 4:
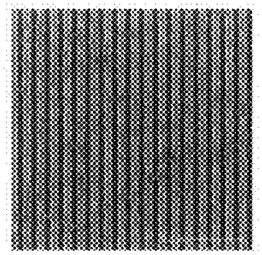
FIG. 4 is a scanning microscopic photograph taken from the upper side of the negative type resist pattern for EUV of Comparative Example 1.

The obtained results are shown in Table 1. Also, the scanning microscopic photograph (upper side of the pattern) of resist patterns in which the composition of Example 1 was applied and the scanning microscopic photograph in which the composition of Comparative Example 1 was applied are shown in FIGS. 3 and 4, respectively.

TABLE 2

| | 25 nm line |
|---|---|
| Example 1 | Good |
| Comparative Example 1 | Collapsed |

INDUSTRIAL APPLICABILITY

The resist underlayer film-forming composition of the present invention can provide a composition for forming a resist underlayer film capable of forming a desired resist pattern as well as a method for producing a substrate having a resist pattern using the resist underlayer film-forming composition, and a method for producing a semiconductor device.

The invention claimed is:

1. An EUV resist underlayer film-forming composition comprising a (meth)acrylic polymer having a basic organic group substituted with a protecting group on a side chain thereof and further comprising an organic solvent, and comprising no polymer other than the (meth)acrylic polymer, wherein the protecting group is selected from a benzyloxycarbonyl group, a 9-fluorenylmethyloxycarbonyl group, a 2,2,2-trichloroethoxycarbonyl group and an allyloxycarbonyl group.

2. The EUV resist underlayer film-forming composition according to claim 1, wherein the (meth)acrylic polymer is a polymer having a unit structure represented by the following formula (1):

(1)

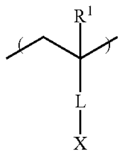

wherein, $R_1$ represents a hydrogen atom or a methyl group, L represents a divalent linking group, and X represents an acyloxy group having an amino group substituted with a protecting group or an acyloxy group having a nitrogen-containing heterocyclic ring substituted with a protecting group.

3. The EUV resist underlayer film-forming composition according to claim 1, further comprising a crosslinking catalyst.

4. The EUV resist underlayer film-forming composition according to claim 1, further comprising a crosslinking agent.

5. An EUV resist underlayer film, which is a baked product of an applied film consisting of the EUV resist underlayer film-forming composition according to claim 1.

6. The EUV resist underlayer film-forming composition according to claim 2, wherein L in formula (1) represents a —C(=O)O$R_2$— group, wherein $R_2$ represents an alkylene group having 1 to 10 carbon atoms, part of the hydrogen atoms of the alkylene group being replaced by a hydroxy group.

7. An EUV resist underlayer film, which is a baked product of an applied film consisting of the EUV resist underlayer film-forming composition according to claim 2.

8. An EUV resist underlayer film, which is a baked product of an applied film consisting of the EUV resist underlayer film-forming composition according to claim 3.

9. An EUV resist underlayer film, which is a baked product of an applied film consisting of the EUV resist underlayer film-forming composition according to claim 4.

* * * * *